United States Patent
Kodama

(10) Patent No.: US 7,411,845 B2
(45) Date of Patent: Aug. 12, 2008

(54) REDUNDANCY CIRCUIT AND SEMICONDUCTOR APPARATUS HAVING THE REDUNDANCY CIRCUIT

(75) Inventor: Takuyo Kodama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 128 days.

(21) Appl. No.: 11/512,235

(22) Filed: Aug. 30, 2006

(65) Prior Publication Data

US 2007/0103999 A1   May 10, 2007

(30) Foreign Application Priority Data

Aug. 30, 2005   (JP)   .............................. 2005-249473

(51) Int. Cl.
  *G11C 7/00*   (2006.01)
(52) U.S. Cl. .................. 365/200; 365/201; 365/189.07
(58) Field of Classification Search ................. 365/200, 365/201, 189.07
See application file for complete search history.

(56) References Cited

U.S. PATENT DOCUMENTS

| 6,967,878 | B2 * | 11/2005 | Dono ......................... 365/200 |
| 7,075,835 | B2 * | 7/2006 | Fujima ....................... 365/200 |
| 7,116,590 | B2 * | 10/2006 | Blodgett ..................... 365/200 |
| 7,123,527 | B2 * | 10/2006 | Kuzuno et al. .............. 365/200 |
| 7,307,910 | B2 * | 12/2007 | Nam et al. ............... 365/225.7 |

FOREIGN PATENT DOCUMENTS

| JP | 6084393 | 3/1994 |
| JP | 2001307497 | 11/2001 |
| JP | 200338192 | 11/2003 |

* cited by examiner

*Primary Examiner*—Tuan T. Nguyen
(74) *Attorney, Agent, or Firm*—Young & Thompson

(57) ABSTRACT

When a redundancy circuit is fully used and a further defect is present, an irreparable-state signal is produced. When the irreparable-state signal is produced, a defect is judged. When the irreparable-state signal is not produced, upon testing for quality judgment, extraction of a defective memory cell, programming an address of the defective memory cell into a fuse, and confirmation about whether or not the address is properly programmed are carried out. Quality judgment is possible only by confirming address information of the written address as confirmation after programming into the electric fuse.

10 Claims, 6 Drawing Sheets

REDUNDANCY CIRCUIT AND SEMICONDUCTOR APPARATUS HAVING THE REDUNDANCY CIRCUIT

This application claims priority to prior Japanese patent application JP 2005-249473, the disclosure of which is incorporated herein by reference.

BACKGROUND OF THE INVENTION

This invention relates to a semiconductor apparatus and, in particular, to a redundancy circuit for repairing a defective memory cell and a semiconductor apparatus having the redundancy circuit.

Recently, a semiconductor apparatus is miniaturized and developed towards larger-scale integration. For example, in the field of a dynamic random access memory (hereinafter abbreviated to DRAM), products having a memory capacity of 1 Gbit are developed and put into practical use.

Such DRAM has a main memory cell array region in which a normal memory cell array is disposed and a redundancy circuit for repair in which a spare memory cell array region is disposed. In case where a defect is found in a part of the main memory cell array region, a defective memory cell is replaced by a spare memory cell. By the use of the redundancy circuit, the semiconductor apparatus integrated in a large scale is improved in yield and lowered in cost.

The redundancy circuit requires a programmable element for memorizing an address of the defective memory cell. As the programmable element, use is predominantly made of a breaking fuse comprising a polysilicon or a metal wire to be cut by a laser trimmer. However, such technique of cutting the fuse by the laser trimmer can not repair a defect after assembling the semiconductor apparatus. In view of the above, use is also made of an electric fuse, such as a capacitor fuse, capable of repairing the defect after assembling.

Repairing by the redundancy circuit is carried out in the following manner. At first, quality judgment of judging whether each product is defective or non-defective is carried out by the use of a tester to extract a defective memory cell. Next, the address of the defective memory cell is programmed into the fuse by the laser trimmer. Then, quality judgment is carried out again by the tester. In case of the electric fuse, the address of the defective memory cell is electrically programmed into the fuse. Thus, testing is carried out twice to extract the defective memory cell and to verify completion of repairing.

Such repairing using the electric fuse is disadvantageous in the following respect. A testing efficiency is low because testing is carried out twice. In the past, a testing time was short. It was therefore possible to carry out testing twice. However, the semiconductor apparatus integrated in a large scale and having a memory capacity on the order of 1 Gbit requires a long testing time. Further, testing is carried out taking into account mutual interference among a number of memory cells and therefore requires a testing time as long as several hours. Such long-time testing is carried out twice upon extracting the defective memory cell and upon verifying completion of repairing. This results in low testing efficiency and high cost.

In order to avoid the above-mentioned problem, it is proposed to carry out testing for verifying completion of repairing only in an area around the repaired memory cell so as to shorten the testing time. In this technique, however, the address of the memory cell to be repaired is different in each individual product. It is therefore necessary to individually test each product by the use of an individual test program. As compared with a current technique of simultaneously testing a plurality of products in parallel, the above-mentioned technique is disadvantageous in view of man-hour required in preparation of a plurality of test programs and a testing time. Thus, the problem of low testing efficiency due to two-times testing remains unsolved.

The redundancy circuit is disclosed in several related documents. Japanese Unexamined Patent application Publication (JP-A) No. H06-084393 (Patent Document 1) corresponding to U.S. Pat. No. 5,313,424 discloses a repairing circuit using an electric fuse. According to Japanese Unexamined Patent Application Publication (JP-A) No. 2003-338192 (Patent Document 2) corresponding to U.S. Patent Application Publication No. 2003-213954 A1, an address of a defective memory cell is latched in an I/O compression test. The latched address is programmed into an electrical fuse. Thereafter, a functional test is performed. According to Japanese Unexamined Patent Application Publication (JP-A) No. 2001-307497 (Patent Document 3) corresponding to U.S. Pat. No. 6,259,639 B1, a memory cell unit has a normal port and a test port. Upon a writing operation via the normal port, an address and data are latched. In a next cycle, data written via the test port in a preceding cycle is read and compared with the latched data. Upon detection of mismatching as a result of comparison, a defective cell is detected and the latched address and the latched data are used as redundant means. The address and the data are latched by software without using a fuse. When the redundant means is full, an overflow signal is produced.

In the above-mentioned patent documents 1 and 2, the problem of low testing efficiency is not yet solved. In the patent document 3, the test port is provided in addition to the normal port so that chip area overhead is large. Further, the patent document 3 discloses a repairing circuit without using a fuse, which is a technique different from this invention. None of these documents discloses any suggestion for solving the problem addressed by this invention, i.e., low testing efficiency due to testing carried out twice, As described above, when the redundancy circuit is used, the quality judgment is at first carried out by the use of the tester to extract the defective memory cell. Next, the address of the defective memory cell is programmed into the fuse. Then, quality judgment is carried out again by the use of the tester. Thus, testing is carried out twice to detect the defective memory cell and to verify completion of repairing. This results in a problem of low testing efficiency.

SUMMARY OF THE INVENTION

It is therefore an object of this invention to provide a redundancy circuit having a high testing efficiency and a semiconductor apparatus having the redundancy circuit.

The redundancy circuit in this invention is a repairing circuit for extracting a defective memory cell by testing for quality judgment, then programming an address of the defective memory cell into a fuse, and verifying that the address is properly programmed. Further, if the redundancy circuit is fully used and a defect which can not be repaired is present, an irreparable-state signal is produced. By the irreparable-state signal, it is possible to judge whether or not the semiconductor apparatus can be repaired. Therefore, confirmation after programming into the electric fuse is performed only by confirming address information of the written address, so that an operation of the redundancy circuit is guaranteed. With the above-mentioned structure, only testing for detecting a defective bit is required and a testing time is therefore shortened.

Thus, it is possible to provide a redundancy circuit having a high testing efficiency and a semiconductor apparatus having the redundancy circuit.

In order to achieve the above-mentioned object, this invention basically adopts the following technique. It will readily be understood that this invention includes various changes and modifications within the scope of the technical gist of this invention.

That is, redundancy circuits according to this invention are as follows:

(1) A redundancy circuit comprising electric fuses and means for carrying out, upon testing for extraction of a defective bit, extraction of a defective bit, writing of a defective bit address into one of the electric fuses as a written address, and testing for confirming the written address.

(2) The redundancy circuit according to the above-mentioned structure (1), further comprising means for producing an irreparable-state signal when all of the electric fuses are used and a defective bit is further detected.

(3) A redundancy circuit comprising a plurality of fuse set blocks each of which has a plurality of electric fuses, and a fuse selection circuit, the fuse selection circuit selecting, during testing for extraction of a defective bit, a particular one of the fuse set blocks to be programmed next, the selected fuse set block being supplied with an address signal as a testing input and holding the address signal in a register circuit, the electric fuses of the selected fuse set block being programmed when a testing result shows a defect judgment, the content of the programmed electric fuses being compared with the address signal held by the register circuit.

(4) The redundancy circuit according to the above-mentioned structure (3), wherein each of the fuse set blocks has an electric fuse into which an enable signal is programmed, the selection circuit being supplied with the enable signal from the programmed fuse set block, the selection circuit inactivating a selection signal to the fuse set block producing the enable signal and activating a selection signal to the fuse set block not producing a next enable signal.

(5) The redundancy circuit according to the above-mentioned structure (4), further comprising means for producing an irreparable-state signal in response to the enable signal produced by the last fuse set block when all of the fuse set blocks are programmed.

(6) The redundancy circuit according to the above-mentioned structure (5), wherein the above-mentioned means produces a different irreparable-state signal in response to the enable signal produced by one of the fuse set blocks except the last fuse set block.

(7) The redundancy circuit according to the above-mentioned structure (4), further comprising an address comparison block for comparing an input address signal and an address programmed in the fuse set block, programming into a new fuse set block being inhibited when the result of comparison in the address comparison block shows matching.

(8) The redundancy circuit according to the above-mentioned structure (4), further comprising a plurality of fuse read/write test block in one-to-one correspondence to bits of the fuse set blocks, and an electric fuse comparison circuit for comparing the programmed content of the electric fuse from a fuse readout circuit and a register output signal from a register output selection circuit to produce an electric fuse comparison result.

(9) The redundancy circuit according to the above-mentioned structure (4), wherein, when a power supply is turned on again upon re-testing, the programmed content of the electric fuse from the fuse readout circuit is written in the register circuit of the fuse set block.

(10) A semiconductor apparatus comprising a redundancy circuit according to any one of the above-mentioned structure (1) to (9).

The redundancy circuit according to this invention carries out, upon testing for extracting a defective bit, extraction of the defective bit, writing an address of the defective bit into an electric fuse, and confirmation of address information of the written address. Confirmation after programming into the electric fuse is carried out only by confirming the address information of the written address. Thus, it is possible to shorten a testing time.

If the redundancy circuit is fully used and a defect which can not be repaired is present, an irreparable-state signal is produced. By the irreparable-state signal, it is possible to judge whether or not a semiconductor apparatus can be repaired. Therefore, confirmation after programming into the electric fuse is performed only by confirming address information of the written address, so that an operation of the redundancy circuit is guaranteed. Thus, the testing time can be shortened.

DESCRIPTION OF THE PREFERRED EMBODIMENTS

Figure 1:
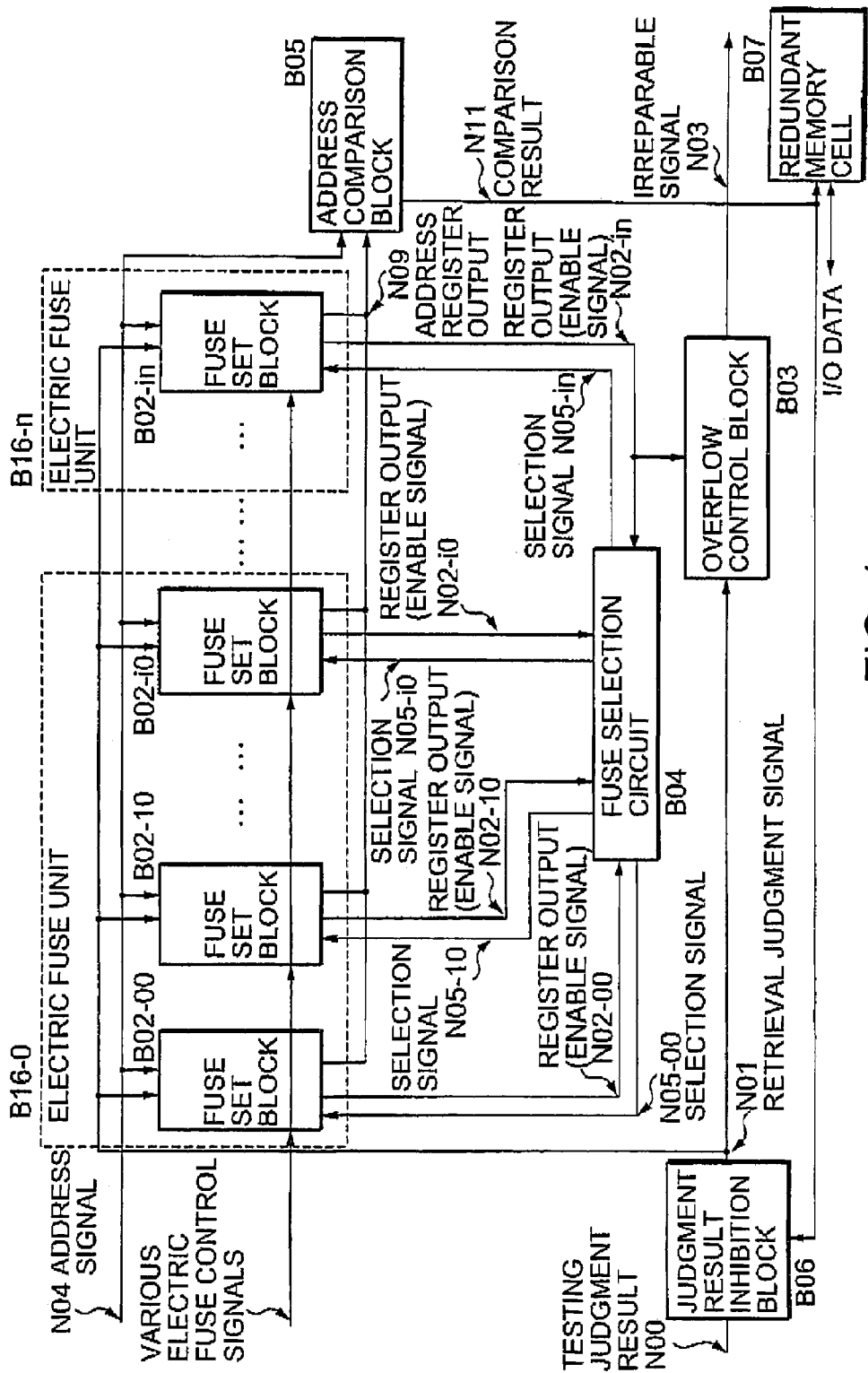
FIG. 1 is a block diagram of a redundancy circuit according to a first embodiment of this invention.

Now, embodiments of this invention will be described with reference to the drawing.

First Embodiment

At first referring to FIGS. 1 to 5, description will be made of a semiconductor apparatus which includes a redundancy circuit according to a first embodiment of this invention.

In FIG. 1, the redundancy circuit of the semiconductor apparatus is supplied with a testing judgment result signal N00, an address signal N04, an I/O data signal, and various electric fuse control signals. The various electric fuse control signals control writing and reading operations to and from an electric fuse. The various electric fuse control signals are, for example in FIG. 3, an electric fuse breaking signal N06, a breaking circuit selection signal N07, a judgment start signal N08, a register retrieval signal N13, and an electric fuse comparison result signal N12.

In FIG. 1, a plurality of electric fuses are grouped into a plurality of fuse set blocks B02 each of which corresponds to a bit to be replaced. Further, the fuse set blocks B02 are grouped into a plurality of electric fuse units B16, Each of the fuse set blocks B02 is supplied with a retrieval judgment signal N01, the address signal N04, a selection signal N05, and the various electric fuse control signals and produces an address register output signal N09 and an enable signal N02. A fuse selection circuit B04 is supplied with the enable signals N02 and produces the selection signals N05.

The last fuse set block B02-in produces the enable signal N02-in which is supplied to the fuse selection circuit B04.

Further, the enable signal N02-in is also supplied to an overflow control block B03 as a redundancy circuit unavailable signal representing that all redundancy circuits are used and unavailable. The overflow control block B03 is supplied with the enable signal N02-in and the retrieval judgment signal N01 and produces an irreparable-state signal N03. When the last fuse set block B02-in is used, an available new redundancy circuit is not present. Therefore, when the retrieval judgment signal N01 is further supplied, the irreparable-state signal N03 is produced because repairing is impossible.

The address register output signals N09 are supplied from the fuse set blocks B02 to an address comparison block B05. The address comparison block B05 compares the address signal N04 and the address register output signals N09 supplied thereto and delivers a comparison result signal N11 to a redundant memory cell B07 and a judgment result inhibition block B06. The redundant memory cell B07 is supplied with the judgment result signal N11 and outputs/inputs I/O data. The judgment result inhibition block B06 is supplied with the comparison result signal N11 and a testing judgment result signal N00 and produces the retrieval judgment signal N01.

The electric fuse units B16 include 0-th to n-th electric fuse units, (n+1) in number. Each of the electric fuse units B16 comprises 0-th to i-th fuse set blocks B02, (i+1) in number. In order to distinguish the electric fuse units B16 from one another, a particular one of the electric fuse units B16 is represented by an electric fuse unit B16-g. In order to distinguish the fuse set blocks B02 from one another, a particular one of the fuse set blocks B02 is represented by a fuse set block B02-gh (g representing a particular fuse set block, h representing a particular electric fuse unit). Collectively, the electric fuse units are denoted by B16 and the fuse set blocks are denoted by B02. This also applies to the signals supplied to and produced from the electric fuse units B16 and the fuse set blocks B02. Thus, suffixes are used if necessary, Referring to FIG. 2, the electric fuse units B16 will be described in detail. Each of the electric fuse units B16 is supplied with the selection signal N05, the address signal N04, and the various electric fuse control signals and produces the enable signal N02, the address register output signal N09, and the electric fuse comparison result signal N12. In each of the electric fuse units B16, a readout set block B18 is provided for the fuse set blocks B02-0 to B02-i.

Each of the fuse set blocks B02 comprises an electric fuse circuit B01-E for recording enable information, a plurality of electric fuse circuits B01-X0 to B01-Xm for recording X address information, a plurality of electric fuse circuits B01-Y0 to B01-Yk for recording Y address information, and a plurality of electric fuse circuits B01-BA0 to B01-BAj for recording bank address information. Each of the all electric fuse circuits is supplied with the selection signal N05, the retrieval judgment signal N01, and the various electric fuse control signals. Further, each of the electric fuse circuits for recording the address information is supplied with each corresponding address signal N04.

Similarly, the readout set block B18 comprises a fuse read/write test block B13-E for reading the enable information, a plurality of fuse read/write test blocks B13-X for reading the X address information, a plurality of fuse read/write test blocks B13-Y for reading the Y address information, and a plurality of fuse read/write test blocks B13-BA for reading the bank address information. The read/write test blocks B13 are provided in correspondence to the enable information (E), X addresses (X0 to Xm), Y addresses (Y0 to Yk), and bank addresses (BA0 to BAj) in the fuse set blocks B02, respectively.

Figure 2:
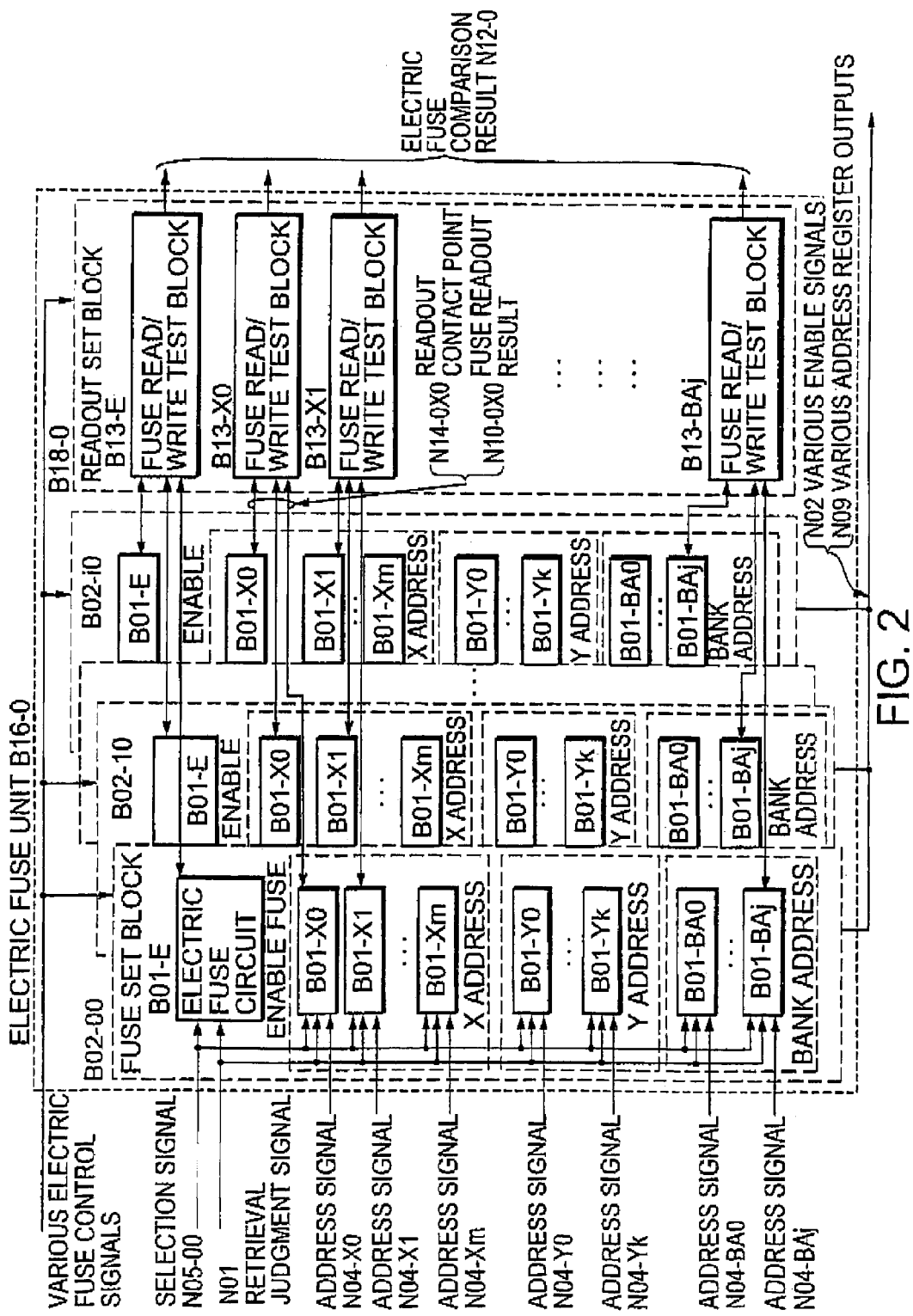
FIG. 2 is a view showing an electric fuse unit in this invention.

The fuse read/write test block B13-E is connected to the electric fuse circuits B01-E disposed in the fuse set blocks B02-00 to B02-i0 for recording the enable information. The fuse read/write test blocks B13-E deliver the electric fuse comparison result signals N12 to the outside of the electric fuse unit B16-0. Similarly, for the X addresses, the Y addresses, and the bank addresses, the fuse read/write test blocks are provided bit by bit. In FIG. 2, the electric fuse unit B16-0 is illustrated by way of example. Each of the electric fuse units B16-1 to B16-n has a similar structure.

Figure 3:
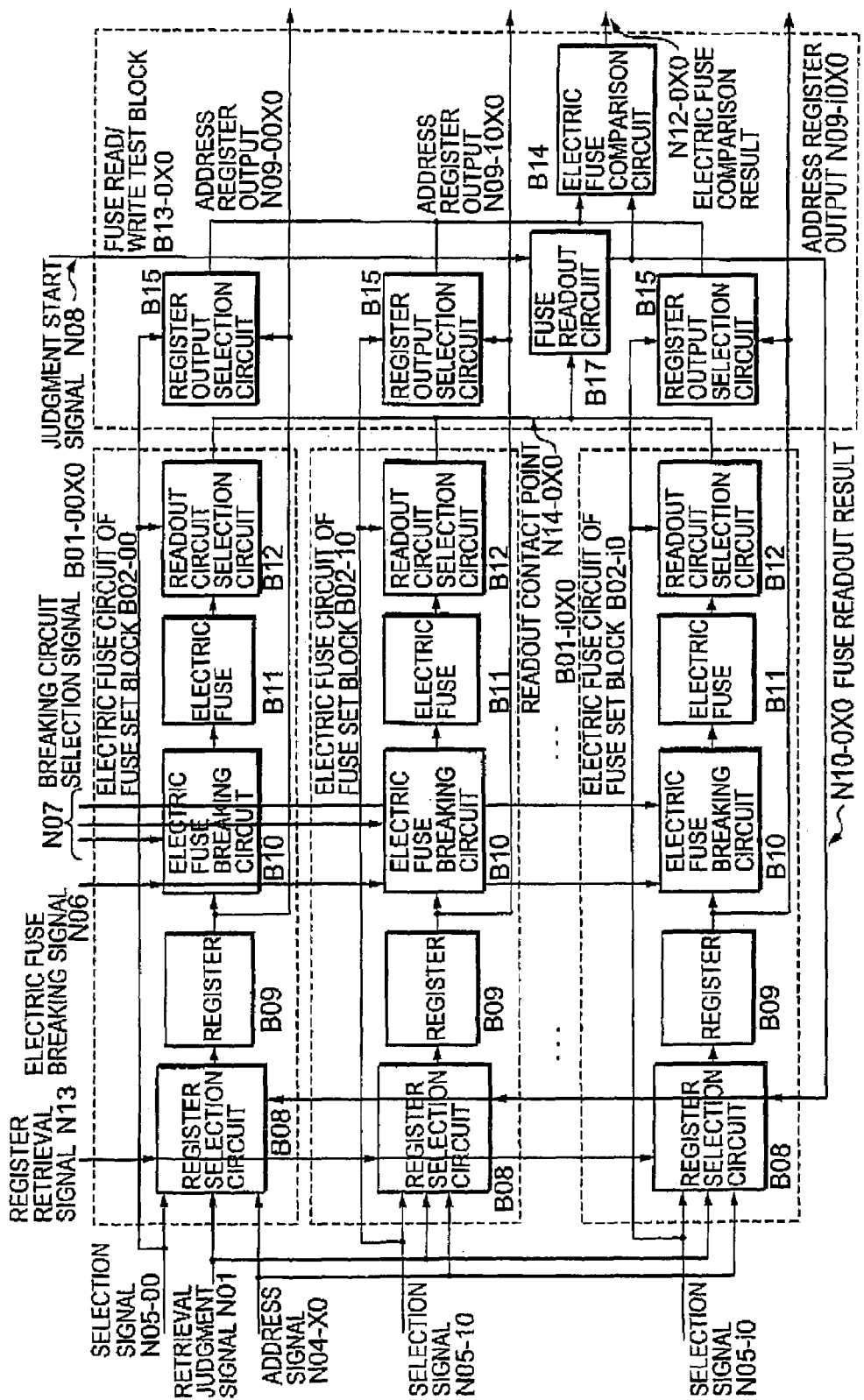
FIG. 3 is a view showing an electric fuse circuit and a fuse reading block in this invention.

Referring to FIG. 3, the electric fuse circuits B01 and the fuse read/write test blocks B13 will be described in detail. The fuse read/write test blocks B13 are provided in correspondence to signal bits (for example, enable, X0, X1, Y0, BAj, etc.) of each of the fuse set blocks B02 in the electric fuse units B16. The electric fuse circuits B01 are similar to one another with respect to an enable fuse and address fuses. Therefore, FIG. 3 only shows a group of the electric fuse circuits B01-X0 and the fuse read/write test block B13-X0 corresponding to the address X0 in the electric fuse unit B16-0.

Each of the electric fuse circuits B01 comprises a register selection circuit B08, a register B09, an electric fuse breaking circuit B10, an electric fuse B11, and a readout circuit selection circuit B12. The electric fuse circuit B01 is supplied with the selection signal N05, the retrieval judgment signal N01, the address signal N04, the register retrieval signal N13, the electric fuse breaking signal N06, the breaking circuit selection signal N07, and a fuse readout result signal N10. The electric fuse circuit B01 produces a readout contact point signal N14 and the address register output signal N09.

The register selection circuit B08 is supplied with the selection signal N05, the retrieval judgment signal N01, and the address signal N04 and produces an output signal supplied to the register B09, The register B09 produces the address register output signal N09. The electric fuse breaking circuit B10 is supplied with the address register output signal N09, the electric fuse breaking signal N06, and the breaking circuit selection signal N07 and produces an output signal supplied to the electric fuse B11. The electric fuse B11 produces an output signal which passes through the readout circuit selection circuit B12 supplied with the selection signal N05 to be outputted from the electric fuse circuit B01 as the readout contact point signal N14.

The electric fuse circuits B01-X0 include the electric fuse circuits B01-00X0 to B01-i0X0 corresponding to the same bit (the address X0 in FIG. 3) in the fuse set blocks B02-00 to B02-i0, Each of the electric fuse circuits B01 produces the address register output signal N09 from the register B09 and the readout contact point signal N14 as electric fuse program information.

The fuse read/write test block B13-0X0 (the suffix 0 indicates the electric fuse unit and the suffix X0 indicate the address X0) comprises a plurality of register output selection circuits B15, a fuse readout circuit B17, and an electric fuse comparison circuit B14. The register output selection circuits B15 are provided in correspondence to the address register output signals N09-00X0 to N09-i0X0 from the respective electric fuse circuits B01. Each of the register output selection circuits B15 is supplied with a corresponding one of the address register output signals N09-00X0 to N09-i0X0 and a corresponding one of the selection signals N05-00 to N05-i0. The register output selection circuits B15 produce output signals which are connected in common to be delivered to the electric fuse comparison circuit B14.

The fuse readout circuit B17 is supplied with the readout contact point signals N14-0X0 delivered from the electric fuse circuits B01 and connected in common and the judgment start signal N08 and produces the fuse readout result signal N10-0X0. The fuse readout result signal N10-0X0 is supplied to the electric fuse comparison circuit B14 and the register selection circuits B08 of the electric fuse circuits B01-00X0 to B01-i0X0. The electric fuse comparison circuit B14 is supplied with the fuse readout result signal N10-0X0 and the output signals delivered from the register output selection circuits B15 and connected in common and produces the electric fuse comparison result signal N12-0X0 which is delivered to the outside of the fuse read/write test block B13-0X0.

FIG. 3 shows the structure of the electric fuse circuit B01 and the fuse read/write test block B13 corresponding to the address X0 by way of example. For the other X addresses, the Y addresses, and the bank addresses, the structure is similar. For the enable fuse, the structure is different in the following respect but is generally similar. Since the structure for the enable fuse will be understood from the following description, the detailed description thereof is omitted.

The register B09 in each of the electric fuse circuits B01 corresponding to the X addresses, the Y addresses, and the bank addresses produces the address register output signal N09. On the other hand, the register B09 in each of the electric fuse circuits B01-E corresponding to the enable fuses produces the enable signal N02 having an output structure same as that of the address register output signal N09. Each of the register selection circuits B08 in the electric fuse circuits B01 corresponding to the X addresses, the Y addresses, and the bank addresses is supplied with the selection signal N05, the retrieval judgment signal N01, the address signal N04, the register retrieval signal N13, and the fuse readout result signal N10. On the other hand, each of the register selection circuits B08 in the electric fuse circuits B01-E corresponding to the enable fuses is supplied with the enable signal, i.e., a signal (fixed signal) meaning the use of redundancy, instead of the address signal N04.

Figure 4:
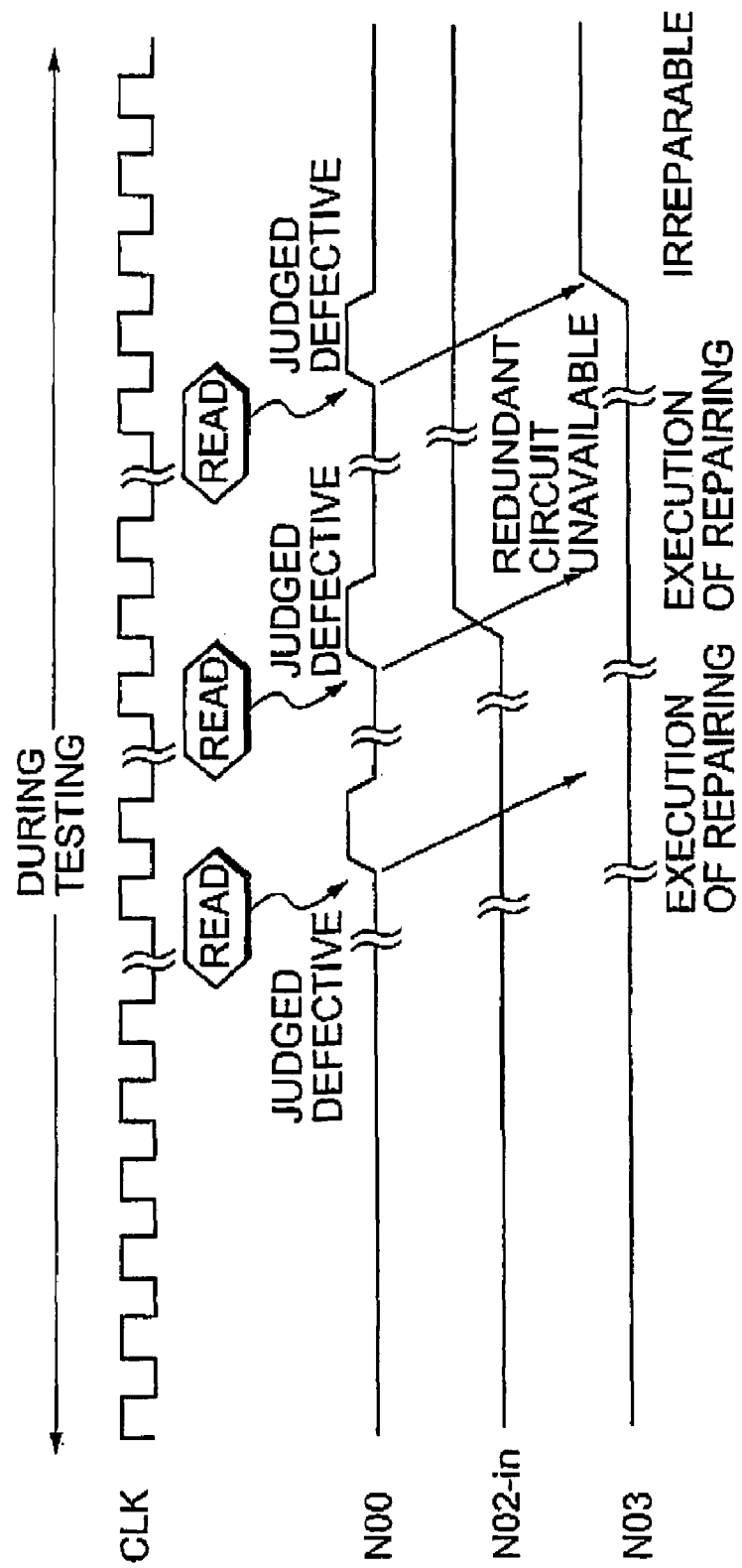
FIG. 4 is a timing chart for describing this invention.

Next referring to FIGS. 4 and 5, description will be made of a repairing operation by the electric fuses illustrated in FIG. 1. FIG. 4 shows the testing judgment result signal N00 synchronized with a CLK signal, the enable signal N02-in produced by the last fuse set block B02-in and used as the redundancy circuit unavailable signal, and the irreparable-state signal N03.

This invention is effective during a test mode of judging a test result in the inside. As the operation of this invention, the semiconductor apparatus is put into the test mode in which the semiconductor apparatus is connected to an external test apparatus. The test mode is set and the register retrieval signal N13 is produced. In this state, a memory operation is started. When the address signal N04 is supplied, the address register output signal N09 delivered from the fuse set block B02 and the address signal N04 are compared. Upon detection of mismatching as a result of address comparison, the judgment result inhibition block B06 produces the retrieval judgment signal N01 in response to the comparison result signal N11 and the testing judgment result signal N00. Upon detection of matching as a result of address comparison, the retrieval judgment signal N01 is not produced as will later be described.

In case of mismatching as a result of address comparison, a defect may occur at a new address. When the testing judgment result signal N00 is produced as defect judgment, the retrieval judgment signal N01 is also produced as defect judgment. The retrieval judgment signal N01 is supplied to a particular one of the fuse set blocks which is selected by the selection output signal N05 from the fuse selection circuit B04. For example, the retrieval judgment signal N01 is supplied to the fuse set block B02-00 of the electric fuse unit B16-0.

Each of the electric fuse circuits B01-X/Y/BA of the fuse set block B02-00 corresponding to the X addresses, the Y addresses, and the bank addresses is put into a data input state when all of the register retrieval signal N13, the selection signal N05, and the retrieval judgment signal N01 are put into a selected state. Data of the address signal N04 passes through the register selection circuit B08 to be recorded in the register B09. After the data are recorded in the register B09, the data are outputted as the address register output signal N09.

The retrieval judgment signal N01 is supplied not only to the electric fuse circuits B01-X/Y/BA corresponding to the addresses but also to the electric fuse circuit B01-E corresponding to the enable fuse. The register selection circuit B08 of the electric fuse circuit B01-E corresponding to the enable fuse is put into a data input state when all of the register retrieval signal N13, the selection signal N05, and the retrieval judgment signal N01 are put into a selected state. The retrieval judgment signal N01 corresponding to a register write input of the address signal N04 in each of the electric fuse circuits B01-X/Y/BA corresponding to the addresses passes through the register selection circuit B08 to be recorded in the register B09.

When the retrieval judgment signal N01 is recorded in the register B09, the enable signal N02-00 as the register output signal corresponding to the enable fuse is produced and supplied to the fuse selection circuit B04. In response, the fuse selection circuit B04 stops activation of the fuse set block B02-00 which has been selected, and produces the selection signal N05-10 for the next fuse set block B02-10. As the fuse set block B02-00 has been used, the fuse set block B02-10 prepares for next address retrieval.

The above-mentioned operation is repeated. When the address retrieval is finished until the last fuse set block B02-in, the output signal from the register B09 of the electric fuse circuit B01-E in the last fuse set block B02-in is produced as the enable signal N02-in. The enable signal N02-in is supplied to the fuse selection circuit B04 so as to stop transmission of the selection signal N05-in from the fuse selection circuit B04 to the last fuse set block B02-in, Simultaneously, the enable signal N02-in is supplied to the overflow control block B03 as the redundancy circuit unavailable signal.

Consequently, even if the retrieval judgment signal N01 is produced following the next testing judgment result signal N00, the overflow control block B03 produces the irreparable-state signal N03 to transfer the information indicating an irreparable state to the outside. As will later be described, at the start of a test, the register B09 of the enable fuse circuit must be set to show an unwritten state.

Upon address retrieval during testing for defect extraction, the address comparison block B05 compares the address register output signal N09 of the fuse set block B02 which has already retrieved the address and the address signal N04. If matching is detected as a result of comparison, matching information is carried on the comparison result signal N11. The judgment result inhibition block B06 blocks the testing judgment result signal N00. Even if the testing judgment result signal N00 indicates a defect, defect information is not transferred to the retrieval judgment signal N01. The address is not retrieved into the fuse set block B02 so as to prevent the address same as the repaired address from being repaired by a plurality of the fuse set blocks B02.

By repeating the above-mentioned operation, the address signal N04 of a defective bit is retrieved into the register B09 of the electric fuse circuit B01. Further, at the last of the testing cycle, the address signal N04 of the defective bit retrieved into the register B09 is programmed into the electric fuse B11. The electric fuse breaking circuit B10 is supplied with the electric fuse breaking signal N06 and the breaking circuit selection signal N07 to break the electric fuse B11. Thus, programming is performed.

Next, referring to FIG. 3, description will be made of an operation of comparing the data of the electric fuse B11 and the data in the register B09 at an address retrieved from the outside. After programming by breaking the electric fuse B11, the data of the electric fuse B11 are read. The fuse readout circuit B17 retrieves the data of the electric fuse B11 of the fuse set block B02 selected by the selection signal N05 of the fuse selection circuit B04. In response to the judgment start signal N08, the fuse readout circuit B17 is operated. The fuse readout circuit B17 is supplied with the data of the electric fuse B11 and produces the fuse readout result signal N10. The fuse readout result signal N10 is supplied to the register selection circuit B08 of the electric fuse circuit B01 and the electric fuse comparison circuit B14.

At this time, in order to prevent the register retrieval signal N13 from being activated, the data recorded in the register B09 are not updated and address data obtained by retrieving the external address are maintained. The address register output signal N09 of the register B09 is supplied also to the register output selection circuit B15 and passes through the register output selection circuit B15 to be supplied to the electric fuse comparison circuit B14. Herein, the electric fuse comparison circuit B14 is supplied with the data of the electric fuse B11 and the data of the register B09 with the external address retrieved and maintained, and compares these data. The electric fuse comparison circuit B14 produces the electric fuse comparison result signal N12 representative of the result of comparison and delivers the electric fuse comparison result signal N12 to the outside.

The above-mentioned operation is carried out for each address bit to carry out comparison and judgment. The above-mentioned operation is repeatedly carried out for all of the fuse set blocks programmed. By the repetition, judgment is made about whether or not the input address matches the address already programmed. The repetition is controlled by the selection signal N05 of the fuse selection circuit B04.

In an operation of confirming programming into the electric fuse, the register retrieval signal N13 is not activated. If the register retrieval signal N13 is activated, the result of reading the electric fuse is memorized in the register B09. On the other hand, in order to read an initial redundancy address of the memory when a power supply is turned on, the register retrieval signal N13 is activated and the data programmed in the electric fuse are memorized in the register B09 to be used as the address register output signal N09.

Figure 5:
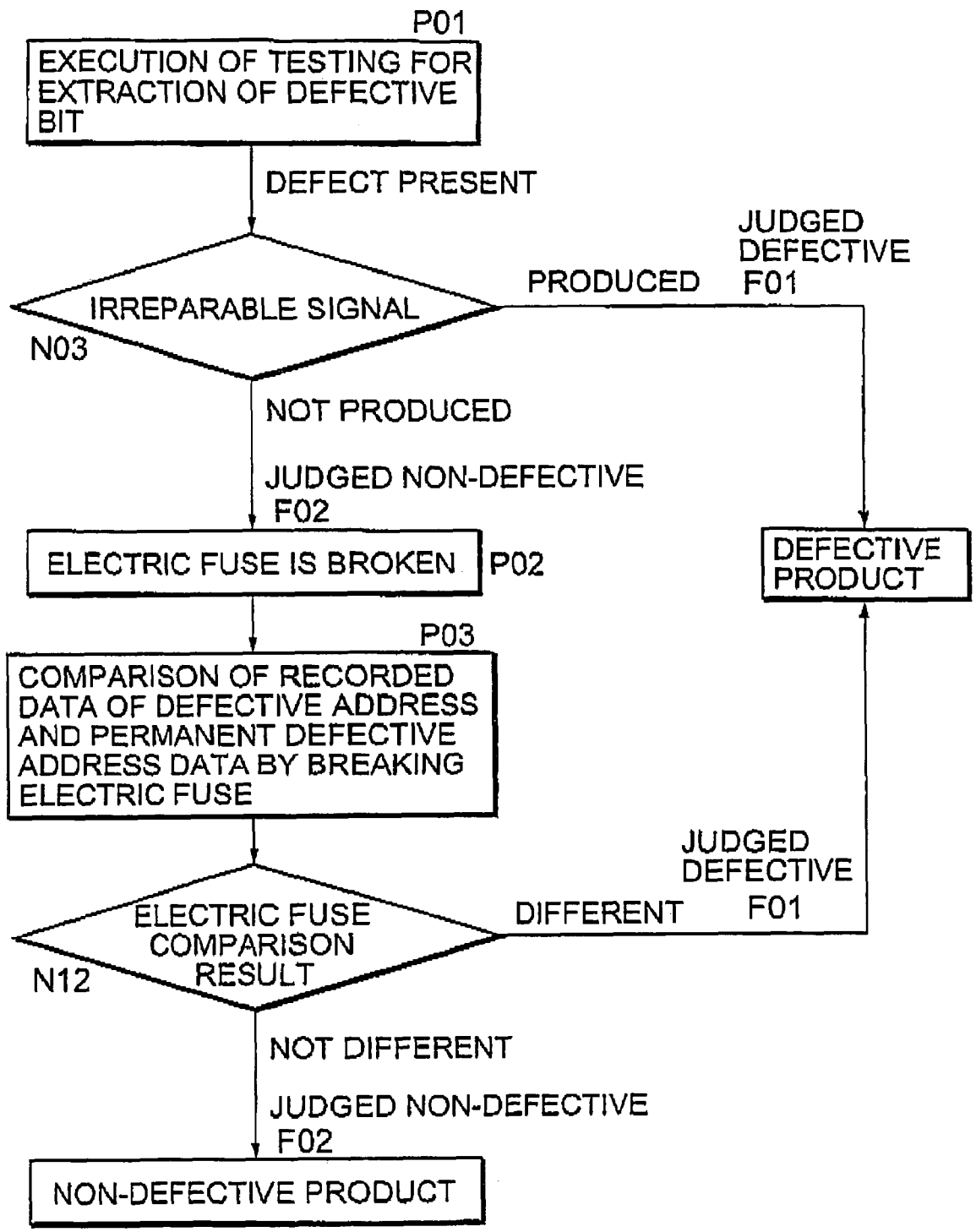
FIG. 5 is a flow chart for describing this invention.

Referring to FIG. 5, description will be made of a test utilizing this invention. FIG. 5 shows an example of a test flow in which, by the use of the result obtained by the operation in FIG. 3, repairing by the electric fuse is carried out only by testing for extraction of a defective bit. In the test flow, the defective bit is extracted upon testing at P01. If the irreparable-state signal N03 is produced, the defective address can not be retrieved into the fuse set block B02. Therefore, repairing is impossible and a product is treated as the defective product (F01).

On the other hand, if the irreparable-state signal N03 is not produced, the defective address can be recorded in the fuse set block B02. Therefore, repairing by the electric fuse is possible and judgment is made as a non-defective product (F02). Subsequently, the above-mentioned operation is repeated. According to the address memorized in the register B09 of the fuse set block B02 at P02 before completion of testing, the electric fuse is broken and programming is performed. By writing into the electric fuse, the defective address data are permanently recorded.

After breaking the electric fuse, confirmation is made that the electric fuse is securely programmed. At P03, the electric fuse comparison circuit B14 in the fuse read/write test block B13 compares the defective address data recorded in the register B09 and the defective address data recorded by breaking the electric fuse. Depending upon the electric fuse comparison result signal N12, a product is treated as a defective product upon mismatching (F03). Upon matching, a product is treated as a non-defective product, judging that repairing is successful.

The above-mentioned testing has been described for a reading operation. However, in the testing, both the reading and the wiring operations are performed upon the memory cell. In the testing, the writing operation is at first performed. In this case, quality judgment is not carried out and, therefore, writing of the address of the defective bit into the register is not carried out. Next, testing for the reading operation of written data is carried out. If a defective bit is detected in the testing for the reading operation, the defective address is successively memorized in the register. At this time, the memory cell at the defective address is tested a plurality of times so that the same address is detected a plurality of times. However, by comparing the addresses, the same defective address is prevented from duplicate writing.

Further, testing may be performed for the memory cell with different data written therein. The bit which is judged as the defective bit in previous testing and whose address is written into the register is replaced by a redundant memory cell and the redundant memory cell is used. Except the above, the written data are subjected to testing in the manner similar to the first testing.

For the redundant memory cell, the operation is subjected to testing in a first cycle of testing and the operation is confirmed. Therefore, by confirming the programmed address, the operation of the redundant memory cell is guaranteed. As the redundant memory cell, either a DRAM memory cell or a SRAM memory cell may be used. In view of the stable operation, the SRAM memory cell is preferable.

In this embodiment, the address of the defective bit found in the testing for extracting the defective bit is successively memorized in the register of the electric fuse circuit. At this time, the address comparison circuit compares the memorized address and the input address. Thus, the same defective address is prevented from being memorized in duplicate. At the last of the testing for extracting the defective bit, the address information memorized in each register is programmed into each corresponding electric fuse. The electric fuse comparison circuit compares the information of the programmed electric fuse and the address register output signal from the register. If the result of comparison indicates OK (or matching), the defective memory is replaced and repaired. If a further defect occurs during the testing after all redundant memory cells are used, the overflow control block produces the irreparable-state signal. By the irreparable signal, the semiconductor apparatus is judged defective.

If the redundancy circuit is fully used and an irreparable defect is present, the irreparable-state signal is produced. By the irreparable signal, judgment is made about whether or not the semiconductor apparatus is repairable. In case where the irreparable-state signal is produced, the semiconductor apparatus is judged defective. If the irreparable-state signal is not produced, the defective bit is replaced by the redundant memory cell and then judgment as a non-defective product is made by confirming programming of the address bit. With this structure, the redundancy circuit which requires only testing for defective bit extraction and a short testing time and the semiconductor apparatus having the redundancy circuit are obtained.

Second Embodiment

Figure 6:
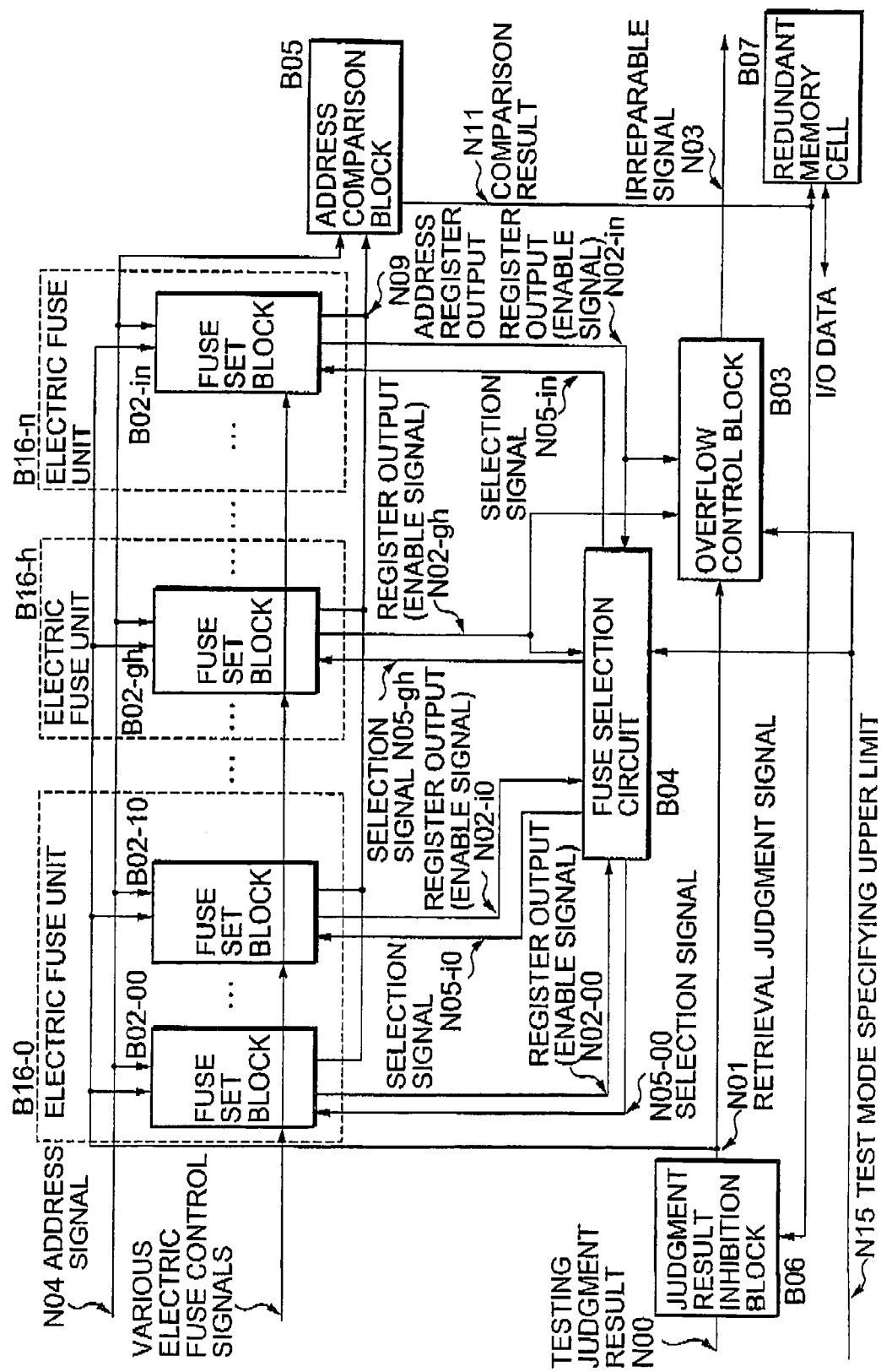
FIG. 6 is a block diagram of a redundancy circuit according to a second embodiment of this invention.

Referring to FIG. 6, description will be made as regards a semiconductor apparatus which includes a redundancy circuit according to a second embodiment of this invention. FIG. 6 shows repairing by an electric fuse. Similar parts are designated by like reference numerals and description thereof will be omitted.

A step of repairing a defective bit by an electric fuse may be carried out by a plurality of steps. For example, the defective bit is repaired by two steps (hereinafter referred to as a first step and a second step). In this case, a part of the redundancy circuit is used in the first step and a remaining part of the redundancy circuit is used in the second step. Thus, in order to reserve a repairing portion to be used in the second step, an upper limit of an available number of the fuse set blocks B02 can be set so that not all the fuse set blocks B02 are used in the first step. After the repairing upper limit of the fuse set blocks B02 in the first step is reached, repairing by the remaining fuse set blocks B02 can be carried out in the second step.

The second embodiment requires two redundancy circuit unavailable signals supplied to the overflow control block B03. In the first embodiment, the enable signal N02-in from the last redundancy circuit is used as the redundancy circuit unavailable signal. In this embodiment, the enable signal N02-in and the intermediate enable signal N02-gh are used as the upper limit number of the fuse set blocks which can be used in the first step.

The structure of the second embodiment is as follows. In FIG. 6, the overflow control block B03 is supplied with the enable signal N02-in from the last fuse set block B02-in among the fuse set blocks mounted, and the enable signal N02-gh (hereinafter referred as an upper limit specifying enable signal) from a particular fuse set block B02-gh arbitrarily determined. The fuse set block B02-gh is an upper limit of the redundancy circuit which can be used in the first step. The upper limit may be selected as desired within a range of the total number of the fuse set blocks mounted. The fuse set blocks B02-00 to B02-gh serve as a redundancy circuit which can be used in the first step. The fuse set block B02-gh is a (g+1)-th fuse set block in the electric fuse unit B16-h. Further, the overflow control block B03 is supplied with the test mode signal N15 specifying the upper limit. The fuse selection circuit B04 is also supplied with the test mode signal N15 specifying the upper limit.

The operation is as follows. When the test mode signal N15 specifying the upper limit is supplied in the first step and if the fuse set block B02-gh is used, the irreparable-state signal N03 is produced. Thereafter, no repairing is performed. The fuse set block B02-gh is used and the enable signal N02-gh is delivered to the overflow control block B03 and the fuse selection circuit B04. The overflow control block B03 produces the irreparable-state signal N03. The fuse selection circuit B04 makes the selection signal N05-gh to the fuse set block N02-gh into an unselected state and makes the selection signal N05-(g+1)h to the next fuse set block N02-(g+1)h kept in an unselected state.

Thus, when a further testing judgment result signal N00 is supplied, the fuse set blocks after the fuse set block B02-gh are held without being supplied with the address and do not retrieve the address. However, the semiconductor apparatus is judged non-defective. In each of the fuse set blocks before the fuse set block B02-gh in which the defective address is memorized in the register, the defective address is programmed into the electric fuse. Confirmation of the programmed address and the address memorized in the register is carried out in the manner similar to the first embodiment.

Subsequently, in the second step, repairing by the electric fuse is executed. In this event, the test mode signal N15 specifying the upper limit is not supplied. For each of the fuse set blocks B02 in which the electric fuse has already been broken by reading the electric fuse when the power supply is turned on, the electric fuse information is read and supplied to the register B09. Therefore, as the enable signal N02 produced from the register B09 of the electric fuse circuit B01 corresponding to the enable fuse, a signal representing that the fuse set block B02 is already used is transmitted and supplied to the fuse selection circuit B04.

From all the enable signals N02 supplied to the fuse selection circuit B04, the fuse selection circuit B04 knows that the fuse set blocks B02-00 to B02-gh have already been used and that the fuse set blocks B02-(g+1)h to B02-in are not yet used. Therefore, the fuse selection circuit B04 produces the selection signal N05-(g+1)h in order to select the fuse set block B02-(g+1)h. It is therefore possible to carry out retrieval of the address to the remaining fuse set blocks B02-(g+1)h to B02-in continuous from those used in the first step.

Such use from the intermediate block can be made as follows. Upon performing this test, other redundancy (redundancy using laser writing fuses) must be available. As best initial setting, all redundancy fuses are set in a read register as initial setting, like in normal use.

The programmed content of the electric fuse is read and the register retrieval signal N13 is set as retrieval. Then, the read result of the electric fuse B11 is held in the register B09. The register B09 produces the address register output signal N09. The fuse set block B02 produces the address register output signal N09 if it is already used and does not produce the address register output signal N09 if it is not yet used. This state is same as the state where only a part of all the fuse set blocks B02 is used upon repairing. Therefore, the fuse blocks B02 not yet written are selected while the fuse blocks B02 already written are not selected. This is because the fuse blocks B02 already written are not selected for which the enable bit is in a used state as a result of reading.

In the redundancy circuit of this embodiment, replacement is carried out in a plurality of steps. The upper limit is imposed upon the number of redundancy circuits used in the first step and the redundancy circuits up to the upper limit are used. In the second step, the remaining redundancy circuits are used. If the last redundancy circuit is used and a further defective bit is found, the irreparable-state signal is produced. By the irreparable-state signal, judgment is made about whether or not the semiconductor apparatus can be repaired. If the irreparable-state signal is produced, the semiconductor apparatus is judged defective. If the irreparable-state signal is not produced, the defective bit is replaced by the redundant memory cell and the semiconductor apparatus is judged non-defective by confirming programming of the address bit. With this structure, the redundancy circuit requiring only the testing for extraction of the defective bit and a short testing time and the semiconductor device having the redundancy circuit are obtained.

Although this invention has been described in conjunction with a few preferred embodiments thereof, this invention may be modified in various other manners within the scope of the appended claims.

What is claimed is:

1. A redundancy circuit comprising electric fuses and means for carrying out, upon testing for extraction of a defective bit, extraction of a defective bit, writing of a defective bit address into one of said electric fuses as a written address, and testing for confirming said written address.

2. The redundancy circuit according to claim 1, further comprising means for producing an irreparable-state signal when all of the electric fuses are used and a defective bit is further detected.

3. A semiconductor apparatus comprising a redundancy circuit according to claim 1.

4. A redundancy circuit comprising a plurality of fuse set blocks each of which has a plurality of electric fuses, and a fuse selection circuit, the fuse selection circuit selecting, during testing for extraction of a defective bit, a particular one of the fuse set blocks to be programmed next, the selected fuse set block being supplied with an address signal as a testing input and holding the address signal in a register circuit, the electric fuses of the selected fuse set block being programmed when a testing result shows a defect judgment, the content of the programmed electric fuses being compared with the address signal held by the register circuit.

5. The redundancy circuit according to claim 4, wherein each of the fuse set blocks has an electric fuse into which an enable signal is programmed, the selection circuit being supplied with the enable signal from the programmed fuse set block, the selection circuit inactivating a selection signal to the fuse set block producing the enable signal and activating a selection signal to the fuse set block not producing a next enable signal.

6. The redundancy circuit according to claim 5, further comprising means for producing an irreparable-state signal in response to the enable signal produced by the last fuse set block when all of the fuse set blocks are programmed.

7. The redundancy circuit according to claim 6, wherein said means produces a different irreparable-state signal in response to the enable signal produced by one of the fuse set blocks except the last fuse set block.

8. The redundancy circuit according to claim 5, further comprising an address comparison block for comparing an input address signal and an address programmed in the fuse set block, programming into a new fuse set block being inhibited when the result of comparison in the address comparison block shows matching.

9. The redundancy circuit according to claim 5, further comprising a plurality of fuse read/write test block in one-to-one correspondence to bits of the fuse set blocks, and an electric fuse comparison circuit for comparing the programmed content of the electric fuse from a fuse readout circuit and a register output signal from a register output selection circuit to produce an electric fuse comparison result.

10. The redundancy circuit according to claim 5, wherein, when a power supply is turned on again upon re-testing, the programmed content of the electric fuse from the fuse readout circuit is written in the register circuit of the fuse set block.

* * * * *